US009721861B2

(12) United States Patent
Otsubo et al.

(10) Patent No.: US 9,721,861 B2
(45) Date of Patent: Aug. 1, 2017

(54) SEMICONDUCTOR DEVICE

(71) Applicant: Mitsubishi Electric Corporation, Tokyo (JP)

(72) Inventors: Yoshitaka Otsubo, Tokyo (JP); Takuya Takahashi, Tokyo (JP); Masaomi Miyazawa, Tokyo (JP); Tetsuo Yamashita, Tokyo (JP); Tomohiro Hieda, Tokyo (JP); Mituharu Tabata, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 86 days.

(21) Appl. No.: 14/687,371

(22) Filed: Apr. 15, 2015

(65) Prior Publication Data

US 2016/0095213 A1  Mar. 31, 2016

(30) Foreign Application Priority Data

Sep. 26, 2014  (JP) ................................ 2014-196742

(51) Int. Cl.
*H05K 7/20* (2006.01)
*H01L 23/24* (2006.01)
(Continued)

(52) U.S. Cl.
CPC ............ *H01L 23/24* (2013.01); *H01L 23/057* (2013.01); *H01L 23/36* (2013.01);
(Continued)

(58) Field of Classification Search
CPC . G06F 1/181–1/182; H05K 7/20218–7/20381;
(Continued)

(56) References Cited

U.S. PATENT DOCUMENTS 7,523,617 B2 * 4/2009 Venkatasubramanian ... F25B 21/02
165/104.33
8,634,220 B2 * 1/2014 Tokuyama ............ H01L 23/473
361/676
(Continued)

FOREIGN PATENT DOCUMENTS

JP  H10-200219 A  7/1998
JP  2001-053404 A  2/2001
(Continued)

*Primary Examiner* — Anthony Haughton
*Assistant Examiner* — Razmeen Gafur
(74) *Attorney, Agent, or Firm* — Studebaker & Brackett PC

(57) ABSTRACT

A semiconductor device includes a semiconductor element and a ceramic circuit substrate on which the semiconductor element is mounted. The ceramic circuit substrate includes a ceramic substrate having one surface and the other surface facing each other, a metal circuit board joined to the one surface of the ceramic substrate and electrically connected to the semiconductor element, and a metal heat-dissipation plate joined to the other surface of the ceramic substrate. The metal circuit board is greater in thickness than the metal heat-dissipation plate. A surface of the metal heat-dissipation plate on a side opposite to the ceramic substrate is larger in area than a surface of the metal circuit board on a side opposite to the ceramic substrate. Thereby, a semiconductor device capable of suppressing warpage of the ceramic substrate can be achieved.

11 Claims, 8 Drawing Sheets

(51) Int. Cl.
*H01L 23/36* (2006.01)
*H01L 23/373* (2006.01)
*H01L 23/498* (2006.01)
*H01L 23/057* (2006.01)
*H01L 23/473* (2006.01)

(52) U.S. Cl.
CPC .... *H01L 23/3735* (2013.01); *H01L 23/49811* (2013.01); *H01L 2224/48091* (2013.01); *H01L 2224/49113* (2013.01); *H01L 2224/73265* (2013.01); *H01L 2924/181* (2013.01); *H01L 2924/19107* (2013.01)

(58) Field of Classification Search
CPC .............. H05K 7/20409–7/20418; H05K 7/20009–7/202; H01L 23/367–23/3677; H01L 23/473; H01L 23/46–23/467
USPC ...... 361/676–678, 679.46–679.54, 688–723; 165/80.1–80.5, 104.33, 185; 174/15.1–15.3, 16.1–16.3, 547, 548; 257/712–722, E23.088; 24/453, 458–459; 454/184; 312/236
See application file for complete search history.

(56) References Cited

U.S. PATENT DOCUMENTS

| | | | | |
|---|---|---|---|---|
| 2001/0040791 A1* | 11/2001 | Mori | H01L 23/34 | 361/704 |
| 2004/0041256 A1* | 3/2004 | Takehara | H01L 23/3677 | 257/712 |
| 2004/0089941 A1* | 5/2004 | Mamitsu | H01L 23/051 | 257/718 |
| 2004/0159940 A1* | 8/2004 | Hiyoshi | H01L 25/072 | 257/732 |
| 2006/0109632 A1* | 5/2006 | Berlin | H01L 23/3677 | 361/719 |
| 2006/0120058 A1* | 6/2006 | Fairchild | H01L 23/13 | 361/761 |
| 2008/0290499 A1* | 11/2008 | Nishi | H01L 23/13 | 257/712 |
| 2009/0086435 A1* | 4/2009 | Suzuki | H01L 23/3735 | 361/704 |
| 2009/0101392 A1 | 4/2009 | Kaga et al. | | |
| 2009/0129028 A1* | 5/2009 | Son | H01L 23/3107 | 361/715 |
| 2009/0166854 A1* | 7/2009 | Jewram | F28F 13/00 | 257/713 |
| 2009/0174063 A1* | 7/2009 | Furukawa | H01L 23/3735 | 257/703 |
| 2009/0289344 A1* | 11/2009 | Morozumi | H01L 23/24 | 257/690 |
| 2010/0002399 A1* | 1/2010 | Mori | H01L 23/3735 | 361/719 |
| 2010/0103623 A1* | 4/2010 | Kwank | H01L 23/13 | 361/709 |
| 2010/0157526 A1* | 6/2010 | Beaupre | H01L 23/473 | 361/689 |
| 2010/0193941 A1* | 8/2010 | Mori | H01L 23/3735 | 257/712 |
| 2010/0290191 A1* | 11/2010 | Lin | H01L 23/49816 | 361/704 |
| 2011/0031612 A1* | 2/2011 | Mitsui | H01L 23/3107 | 257/713 |
| 2011/0069455 A1* | 3/2011 | Tokuyama | H01L 23/473 | 361/702 |
| 2012/0182692 A1* | 7/2012 | Mori | H01L 23/3735 | 361/709 |
| 2012/0235293 A1* | 9/2012 | Jones | H01L 23/3735 | 257/714 |
| 2013/0010429 A1* | 1/2013 | Tonomura | H01L 23/3735 | 361/720 |
| 2013/0062750 A1* | 3/2013 | Lenniger | H01L 23/473 | 257/691 |
| 2013/0075889 A1* | 3/2013 | Pagaila | H01L 23/552 | 257/713 |
| 2013/0134572 A1* | 5/2013 | Lenniger | H01L 23/367 | 257/690 |
| 2013/0285234 A1* | 10/2013 | Uhlemann | H01L 23/367 | 257/712 |
| 2013/0343002 A1* | 12/2013 | Kim | H05K 7/20927 | 361/717 |
| 2015/0223317 A1* | 8/2015 | Oi | H05K 1/181 | 361/709 |

FOREIGN PATENT DOCUMENTS

| | | |
|---|---|---|
| JP | 2008-010520 A | 1/2008 |
| JP | 2012-169678 A | 9/2012 |

* cited by examiner

SEMICONDUCTOR DEVICE

BACKGROUND OF THE INVENTION

Field of the Invention

The present invention relates to a semiconductor device, and particularly to a semiconductor device including a ceramic circuit substrate.

Description of the Background Art

Conventionally, a ceramic circuit substrate has been used in a power semiconductor device such as a GTO (Gate Turn Off Thyristor) and an IGBT (Insulated Gate Bipolar Transistor). In this ceramic circuit substrate, a ceramic substrate has one surface to which a metal circuit board is joined and the other surface to which a metal heat-dissipation plate is joined. Then, a semiconductor element is mounted on the metal circuit board, and a heat sink is joined to the metal heat-dissipation plate.

Since the metal circuit board is greater in coefficient of thermal expansion than the ceramic substrate, the metal circuit board expands more than the ceramic substrate due to the heat produced when using the semiconductor element. Accordingly, warpage occurs in the ceramic substrate.

For example, Japanese Patent Laying-Open No. 10-200219 discloses a circuit substrate including a ceramic substrate having: one surface on which a metal circuit board is formed; and the opposite surface on which a metal heat-dissipation plate is formed. According to the circuit substrate disclosed in this publication, the ratio between the thickness of the metal circuit board and the thickness of the metal heat-dissipation plate as well as the margin width between the outer circumferential edge of the ceramic substrate and the outer circumferential edge of each of the metal circuit and the metal heat-dissipation plate are set so as to fall within a prescribed numerical value range. Thereby, occurrence of cracking in the ceramic substrate is suppressed.

In the circuit substrate disclosed in the above-mentioned publication, the circuit pattern of the metal circuit board is not taken into consideration. When the metal circuit board is simply increased in thickness without any consideration of the circuit pattern of the metal circuit board, the expansion amount of the metal circuit board is increased due to the heat generated when using the semiconductor element. Accordingly, large warpage occurs in the ceramic substrate, which may lead to breakage of the ceramic substrate.

SUMMARY OF THE INVENTION

The present invention has been made in light of the above-described problems. An object of the present invention is to provide a semiconductor device capable of suppressing warpage in a ceramic substrate.

A semiconductor device of the present invention includes: a semiconductor element; and a ceramic circuit substrate on which the semiconductor element is mounted. The ceramic circuit substrate includes a ceramic substrate having one surface and the other surface that face each other, a metal circuit board joined to the one surface of the ceramic substrate and electrically connected to the semiconductor element, and a metal heat-dissipation plate joined to the other surface of the ceramic substrate. The metal circuit board is greater in thickness than the metal heat-dissipation plate. A surface of the metal heat-dissipation plate on a side opposite to the ceramic substrate is larger in area than a surface of the metal circuit board on a side opposite to the ceramic substrate.

According to the semiconductor device of the present invention, the metal circuit board having a circuit pattern formed thereon is greater in thickness than the metal heat-dissipation plate. Also, the surface of the metal heat-dissipation plate on the side opposite to the ceramic substrate is larger in area than the surface of the metal circuit board on the side opposite to the ceramic substrate. Accordingly, the volume of the metal circuit board and the volume of the metal heat-dissipation plate can be balanced. Thereby, it becomes possible to suppress warpage of the ceramic substrate caused by thermal stress generated in the ceramic substrate. Therefore, breakage of the ceramic substrate can be suppressed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The embodiments of the present invention will be hereinafter described with reference to the accompanying drawings.

(First Embodiment)

First, the configuration of a semiconductor device according to the first embodiment of the present invention will be hereinafter described with reference to FIGS. 1 to 4.

Figure 1:
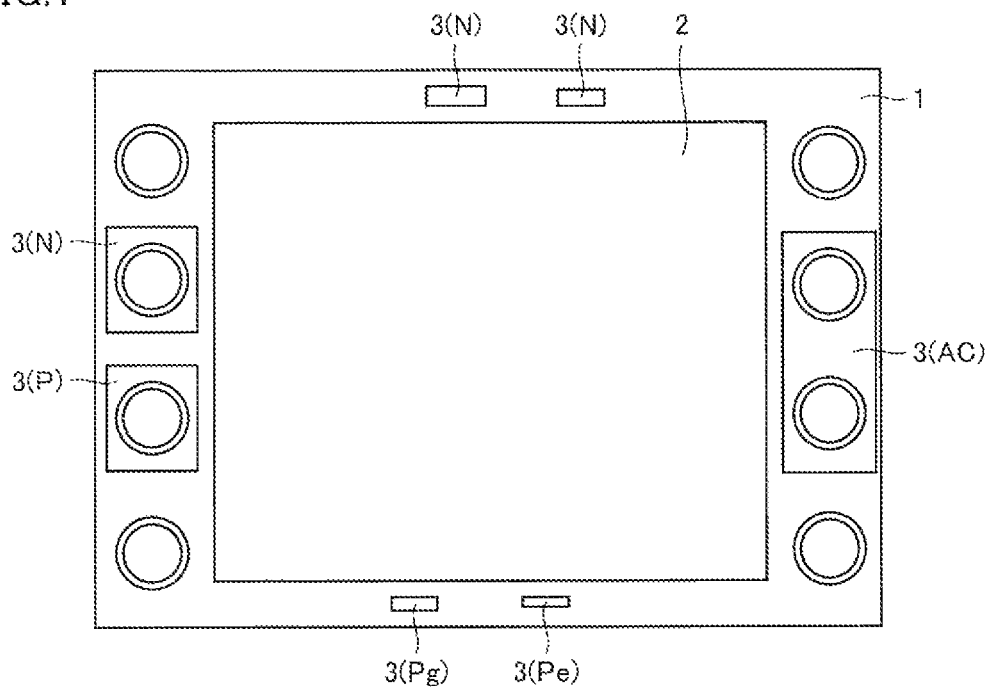
FIG. 1 is a plan view schematically showing a semiconductor device according to the first embodiment of the present invention.
Figure 2:
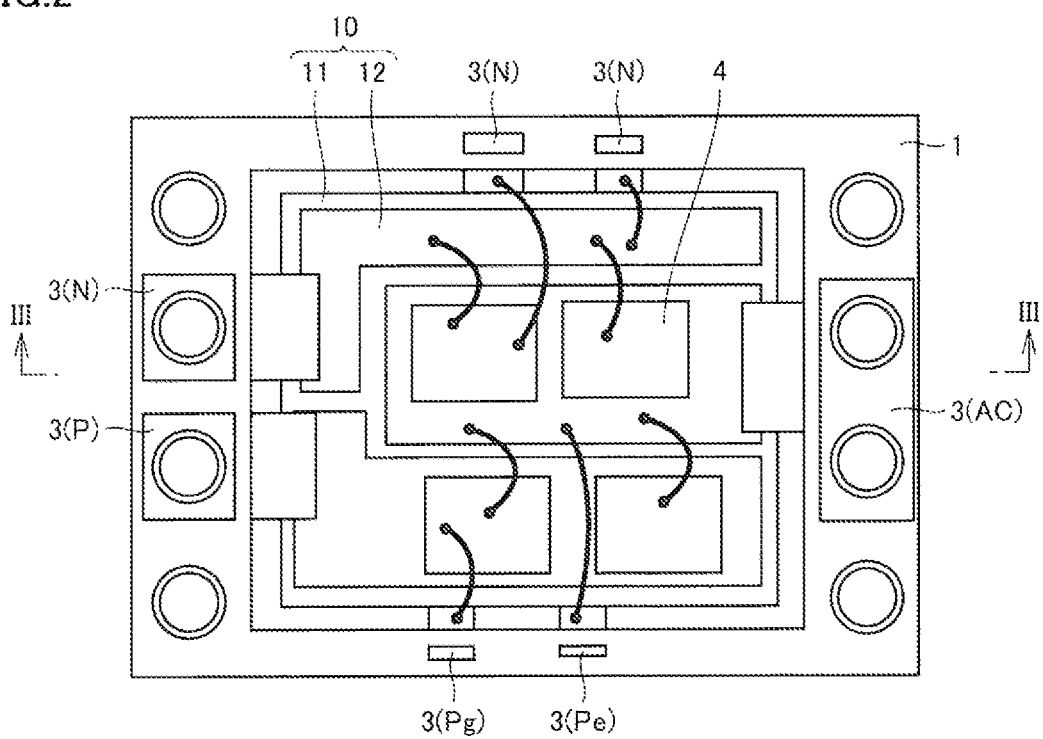
FIG. 2 is a plan view showing the state where a cover of the semiconductor device shown in FIG. 1 is removed.
Figure 3:
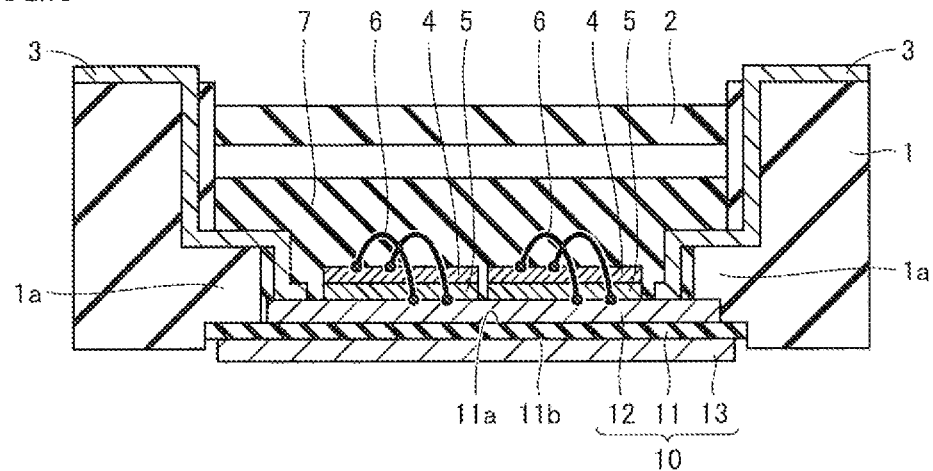
FIG. 3 is a cross-sectional view taken along a line III-III in FIG. 2.

Referring to FIGS. 1 to 3, a semiconductor device of the present embodiment is a power module, for example. The semiconductor device of the present embodiment mainly has a casing 1, a cover 2, an electrode terminal 3, a semiconductor element 4, a solder 5, a wiring line 6, a sealing resin 7, and a ceramic circuit substrate 10. It is to be noted that sealing resin 7 is not shown in FIG. 2 for the sake of clarity.

Mainly referring to FIG. 1, casing 1 has one surface to which cover 2 is attached. Cover 2 serves to perform dust-proofing and water-proofing functions. Ceramic circuit substrate 10 is attached to the other surface of casing 1 on the side opposite to the one surface. Casing 1 is formed around ceramic circuit substrate 10. Casing 1 is formed of resin, for example. An example of this resin may be PPS (polyphenylene sulfide).

Electrode terminal 3 is attached to casing 1. Electrode terminal 3 is exposed on the one surface side of casing 1. Furthermore, electrode terminal 3 is exposed on the inner circumferential side of casing 1. Electrode terminal 3 includes a plurality of negative electrode input terminals (N), a positive electrode input terminal (P), a gate terminal (Pg), a ground terminal (Pe), and an alternating-current electrode terminal (AC).

Mainly referring to FIGS. 2 and 3, semiconductor element 4 is mounted on ceramic circuit substrate 10. Semiconductor element 4 is joined to ceramic circuit substrate 10 via solder 5. Semiconductor element 4 is, for example, a power semiconductor element. Semiconductor element 4 is specifically an IGBT (Insulated Gate Bipolar Transistor), a GTO (Gate Turn Off Thyristor), an MOSFET (Metal Oxide Semiconductor Field Effect Transistor), or the like.

It is preferable that semiconductor element 4 is formed of a wideband gap material. In other words, semiconductor element 4 includes a material having an energy band gap of 2 eV or higher. Specifically, semiconductor element 4 is a semiconductor chip made using a material such as silicon carbide, gallium nitride, or a diamond. In addition, silicon carbide has an energy band gap of 2.20 eV to 3.02 eV, gallium nitride has an energy band gap of 3.39 eV, and a diamond has an energy band gap of 5.47 eV.

Figure 4:
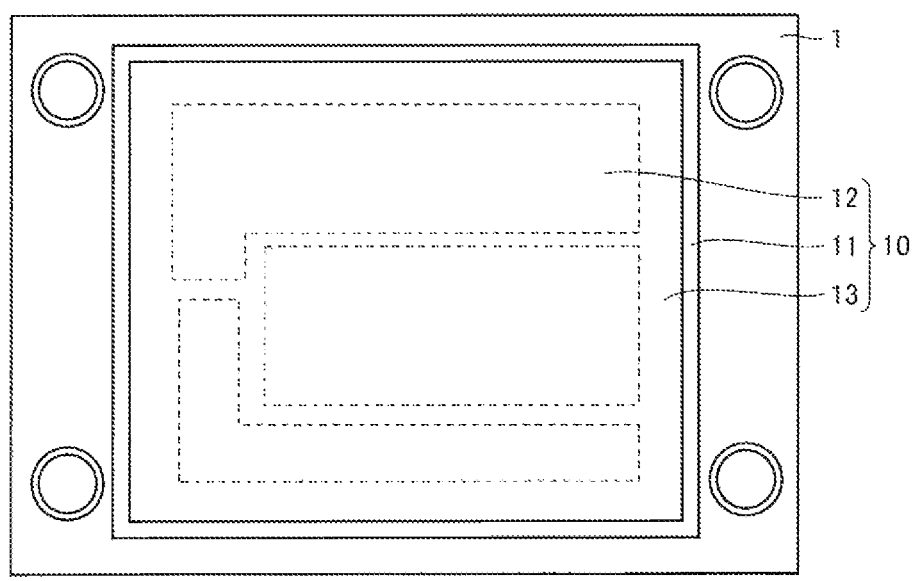
FIG. 4 is a bottom view schematically showing the semiconductor device according to the first embodiment of the present invention.

Mainly referring to FIGS. 3 and 4, ceramic circuit substrate 10 includes a ceramic substrate 11, a metal circuit board 12, and a metal heat-dissipation plate 13. Ceramic substrate 11 has one surface 11a and the other surface 11b that face each other. The thickness of ceramic substrate 11 between one surface 11a and the other surface 11b is 0.25 mm or more and 0.635 mm or less, for example. Specifically, the thickness of ceramic substrate 11 can be, for example, 0.25 mm, 0.32 mm or 0.635 mm. Furthermore, ceramic substrate 11 is formed in an outer shape having a length of 80 mm and a width of 55 mm, for example.

Ceramic substrate 11 is formed, for example, of a silicon nitride material, an aluminum nitride material, or an aluminum oxide material. It is preferable that ceramic substrate 11 is formed of a silicon nitride material. In other words, it is preferable that ceramic substrate 11 includes silicon nitride.

Metal circuit board 12 is joined to one surface 11a of ceramic substrate 11. Metal circuit board 12 is electrically connected to semiconductor element 4. Metal circuit board 12 is joined to semiconductor element 4 via solder 5. Metal circuit board 12 has a circuit pattern.

The thickness of metal circuit board 12 can be changed in accordance with the thickness of ceramic substrate 11. For example, when ceramic substrate 11 has a thickness of 0.25 mm, metal circuit board 12 can be formed to have a thickness of 0.6 mm or more and 0.8 mm or less. Furthermore, for example, when ceramic substrate 11 has a thickness of 0.32 mm, metal circuit board 12 can be formed to have a thickness of 0.8 mm or more and 1.0 mm or less. For example, when ceramic substrate 11 has a thickness of 0.635 mm, metal circuit board 12 can be formed to have a thickness of 1.0 mm or more and 2.0 mm or less. Furthermore, metal circuit board 12 is formed in an outer shape having a length of 74 mm and a width of 49 mm, for example. This outer shape of metal circuit board 12 corresponds to the shape of the outer edge of metal circuit board 12 excluding a circuit pattern.

Metal circuit board 12 is formed, for example, of copper, aluminum, silver, and alloys thereof. It is preferable that metal circuit board 12 is formed of copper. In other words, it is preferable that metal circuit board 12 includes copper.

Metal heat-dissipation plate 13 is joined to the other surface 11b of ceramic substrate 11. Metal heat-dissipation plate 13 is formed, for example, of a solid metal plate. In this case, metal heat-dissipation plate 13 does not have a pattern.

The thickness of metal heat-dissipation plate 13 can be changed in accordance with the thickness of ceramic substrate 11. For example, when ceramic substrate 11 has a thickness of 0.25 mm, metal heat-dissipation plate 13 can be formed to have a thickness of 0.5 mm or more and 0.7 mm or less. Furthermore, for example, when ceramic substrate 11 has a thickness of 0.32 mm, metal heat-dissipation plate 13 can be formed to have a thickness of 0.6 mm or more and 0.9 mm or less. For example, when ceramic substrate 11 has a thickness of 0.635 mm, metal heat-dissipation plate 13 can be formed to have a thickness of 1.0 mm or more and 2.0 mm or less. Furthermore, metal heat-dissipation plate 13 is formed in an outer shape having a width of 78.4 mm and a length of 53.4 mm, for example. This outer shape of metal heat-dissipation plate 13 corresponds to the shape of the outer edge of metal heat-dissipation plate 13.

Metal heat-dissipation plate 13 is formed, for example, of copper, aluminum, silver, and alloys thereof. It is preferable that metal heat-dissipation plate 13 is formed of copper. In other words, it is preferable that metal heat-dissipation plate 13 includes copper.

Metal circuit board 12 is greater in thickness than metal heat-dissipation plate 13. The surface of metal heat-dissipation plate 13 on the side opposite to ceramic substrate 11 is larger in area than the surface of metal circuit board 12 on the side opposite to ceramic substrate 11.

It is preferable that the ratio of the volume of metal circuit board 12 to the volume of metal heat-dissipation plate 13 is 70% or more and 130% or less. Furthermore, it is preferable that metal circuit board 12 is greater in volume than metal heat-dissipation plate 13. Furthermore, it is preferable that the ratio of the thickness of metal circuit board 12 to the thickness of metal heat-dissipation plate 13 is 6/5 or more and 4/3 or less.

In the present embodiment, casing 1 supports ceramic substrate 11. Casing 1 includes a projecting portion 1a. Projecting portion 1a projects directly above one surface 11a of ceramic substrate 11. Projecting portion 1a rests on one surface 11a. Projecting portion 1a is fixed, for example, to one surface 11a with an adhesive. At least a part of metal heat-dissipation plate 13 is located so as to overlap with projecting portion 1a when viewed from the direction in which one surface 11a and the other surface 11b face each other. In other words, ceramic substrate 11 is sandwiched between metal heat-dissipation plate 13 and projecting portion 1a. Projecting portion 1a is supported by metal heat-dissipation plate 13 with ceramic substrate 11 interposed therebetween. Projecting portion 1a may be provided on both sides of casing 1 with semiconductor element 4 interposed therebetween. Metal heat-dissipation plate 13 may support projecting portion 1a on both sides of the casing.

Again mainly referring to FIGS. 2 and 3, wiring line 6 is connected to metal circuit board 12 and semiconductor element 4. Furthermore, wiring line 6 is connected to semiconductor element 4 and electrode terminal 3. Wiring line 6 is also connected to electrode terminal 3 and metal circuit board 12. Accordingly, semiconductor element 4, electrode terminal 3 and metal circuit board 12 are electrically connected to one another by wiring line 6. Wiring line 6 is formed, for example, of aluminum.

Semiconductor element 4, solder 5, wiring line 6, and sealing resin 7 are housed in the internal space surrounded by casing 1, cover 2 and ceramic circuit substrate 10. Semiconductor element 4, solder 5 and wiring line 6 are covered with sealing resin 7 within the internal space. Sealing resin 7 is silicone gel, for example.

Then, the functions and effects of the semiconductor device of the present embodiment will be described.

According to the semiconductor device of the present embodiment, metal circuit board 12 having a circuit pattern formed thereon is greater in thickness than metal heat-dissipation plate 13. Also, the surface of metal heat-dissipation plate 13 on the side opposite to ceramic substrate 11 is larger in area than the surface of metal circuit board 12 on the side opposite to ceramic substrate 11. Accordingly, the volume of metal circuit board 12 and the volume of metal heat-dissipation plate 13 can be balanced. In other words, the volume of metal circuit board 12 having a circuit pattern formed thereon is compensated, thereby allowing metal circuit board 12 and metal heat-dissipation plate 13 to have similar volumes. Thereby, it becomes possible to suppress warpage of ceramic substrate 11 caused by thermal stress generated in ceramic substrate 11. Therefore, breakage of ceramic substrate 11 can be suppressed.

Furthermore, in the present embodiment, each of metal circuit board 12 and metal heat-dissipation plate 13 can be formed to have a thickness of 0.6 mm or more. Since the thickness of each of metal circuit board 12 and metal heat-dissipation plate 13 in the conventional case is about 0.3 mm, the heat dissipation performance of each of metal circuit board 12 and metal heat-dissipation plate 13 can be improved in the present embodiment as compared with the conventional case.

Furthermore, according to the semiconductor device of the present embodiment, the ratio of the volume of metal circuit board 12 to the volume of metal heat-dissipation plate 13 is 70% or more and 130% or less. Thereby, warpage of ceramic substrate 11 can be suppressed.

Furthermore, according to the semiconductor device of the present embodiment, metal circuit board 12 is greater in volume than metal heat-dissipation plate 13. Thereby, warpage of ceramic substrate 11 toward metal heat-dissipation plate 13 can be suppressed even if the surface of metal heat-dissipation plate 13 on the side opposite to ceramic substrate 11 is larger in area than the surface of metal circuit board 12 on the side opposite to ceramic substrate 11.

Furthermore, according to the semiconductor device of the present embodiment, the ratio of the thickness of metal circuit board 12 to the thickness of metal heat-dissipation plate 13 is 6/5 or more and 4/3 or less. Thereby, warpage of ceramic substrate 11 can be suppressed.

Furthermore, according to the semiconductor device of the present embodiment, ceramic substrate 11 includes silicon nitride. Thereby, cracking can be less likely to occur in ceramic substrate 11.

Furthermore, according to the semiconductor device of the present embodiment, each of metal circuit board 12 and metal heat-dissipation plate 13 includes copper. Since the thermal conductivity of copper is higher than the thermal conductivity of iron (80 W/mK), the heat dissipation performance of each of metal circuit board 12 and metal heat-dissipation plate 13 can be improved. Furthermore, since copper is less expensive than silver, metal circuit board 12 and metal heat-dissipation plate 13 can be reduced in cost. Since copper is excellent in workability, the productivity of metal circuit board 12 and metal heat-dissipation plate 13 can be improved.

Furthermore, according to the semiconductor device of the present embodiment, semiconductor element 4 includes a material having an energy band gap of 2 eV or higher. According to the semiconductor device of the present embodiment, metal circuit board 12 is increased in thickness, thereby reducing an inductance. This allows a reduction in the surge voltage generated at the time of operation of semiconductor element 4 during high-speed switching.

Furthermore, according to the semiconductor device of the present embodiment, at least a part of metal heat-dissipation plate 13 is located so as to overlap with projecting portion 1a when viewed from the direction in which one surface 11a and the other surface 11b of ceramic substrate 11 face each other. Thereby, projecting portion 1a can be supported by metal heat-dissipation plate 13. Consequently, the stress exerted by casing 1 upon ceramic substrate 11 can be reduced. Furthermore, casing 1 can be readily attached to ceramic substrate 11.

(Second Embodiment)

The semiconductor device according to the second embodiment of the present invention will be hereinafter described. The same components as those in the first embodiment are designated by the same reference characters and the description thereof will not be repeated unless otherwise specified. This also applies to the third and fourth embodiments set forth below.

Figure 5:
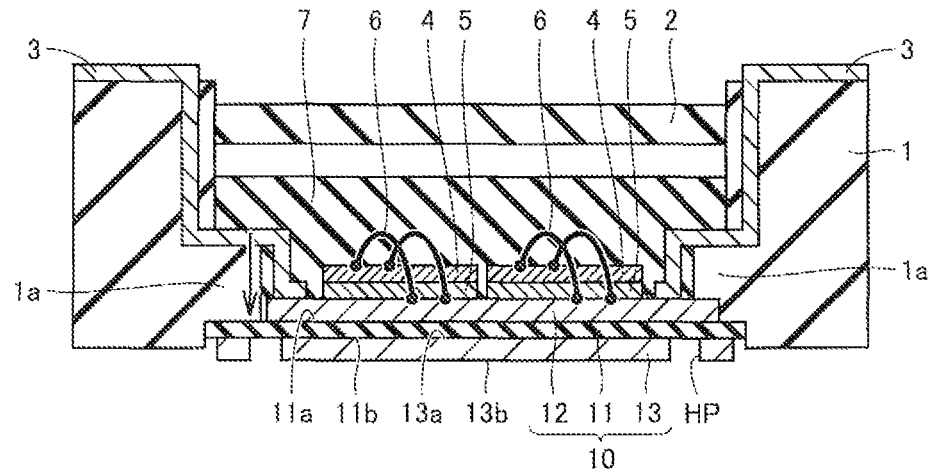
FIG. 5 is a cross-sectional view schematically showing a semiconductor device according to the second embodiment of the present invention.
Figure 6:
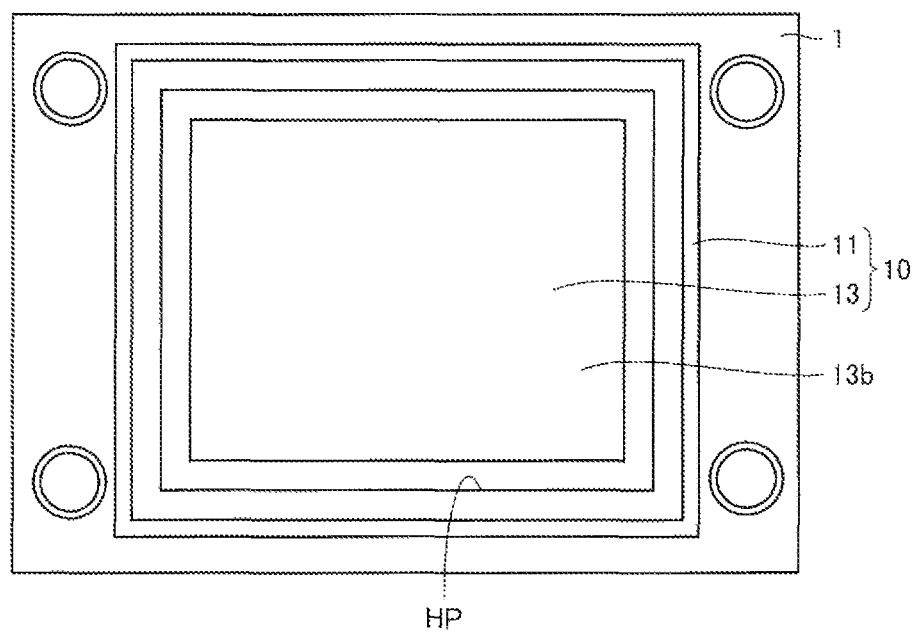
FIG. 6 is a bottom view schematically showing the semiconductor device according to the second embodiment of the present invention.

Referring to FIGS. 5 and 6, the semiconductor device of the second embodiment is mainly different from the semiconductor device of the first embodiment in that metal heat-dissipation plate 13 has a concave portion HP. Metal heat-dissipation plate 13 has a first surface 13a and a second surface 13b. First surface 13a is joined to ceramic substrate 11. Second surface 13b faces first surface 13a. Metal heat-dissipation plate 13 has a concave portion HP provided in second surface 13b.

In the present embodiment, concave portion HP is formed as a groove. Furthermore, concave portion HP penetrates first surface 13a and second surface 13b of metal heat-dissipation plate 13. Concave portion HP does not have to penetrate first surface 13a and second surface 13b of metal heat-dissipation plate 13, but metal heat-dissipation plate 13 only has to be reduced in volume due to concave portion HP. Thereby, thermal expansion of metal heat-dissipation plate 13 can be suppressed.

Furthermore, in the present embodiment, concave portion HP is formed along the outer edge of metal heat-dissipation plate 13. Concave portion HP does not have to be formed along the outer edge of metal heat-dissipation plate 13, but only has to be formed in any part of second surface 13b of metal heat-dissipation plate 13.

Furthermore, in the present embodiment, concave portion HP is formed along the entire circumference of the outer edge of metal heat-dissipation plate 13. Concave portion HP does not have to be formed along the entire circumference of the outer edge of metal heat-dissipation plate 13, but only has to be formed along a part of the outer edge of metal heat-dissipation plate 13.

Furthermore, in the present embodiment, concave portion HP is formed in a linear shape as seen in plan view. Concave portion HP does not have to be formed in a linear shape as seen in plan view, but may be formed in a curved line as seen in plan view. Furthermore, concave portion HP may be a hole.

According to the semiconductor device of the present embodiment, metal heat-dissipation plate 13 has concave portion HP provided in second surface 13b. Accordingly, thermal expansion of metal heat-dissipation plate 13 is suppressed by this concave portion HP. Thereby, warpage of ceramic substrate 11 can be suppressed.

(Third Embodiment)

The semiconductor device according to the third embodiment of the present invention will be hereinafter described.

Figure 7:
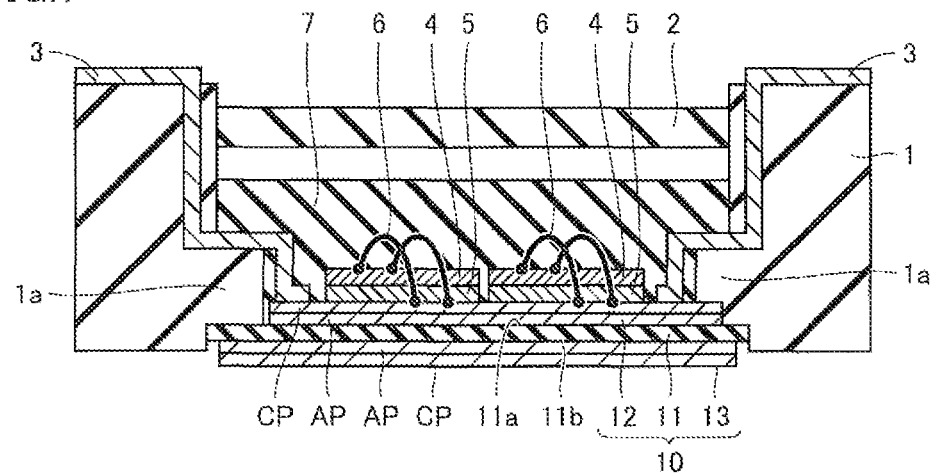
FIG. 7 is a cross-sectional view schematically showing a semiconductor device according to the third embodiment of the present invention.

Referring to FIG. 7, the semiconductor device according to the third embodiment is mainly different from the semiconductor device according to the first embodiment in that each of the metal circuit board and the metal heat-dissipation plate includes a copper member and an aluminum member. Each of the metal circuit board and the metal heat-dissipation plate in the semiconductor device according to the present embodiment is a so-called clad member.

Each of metal circuit board 12 and metal heat-dissipation plate 13 includes a copper member CP and an aluminum member AP. Aluminum member AP covers copper member CP. Specifically, copper member CP and aluminum member AP are laminated. Aluminum member AP has a thickness of 0.1 mm or more and 0.5 mm or less, for example. Ceramic substrate 11 is joined to both of aluminum member AP of metal circuit board 12 and aluminum member AP of metal heat-dissipation plate 13.

According to the semiconductor device of the present embodiment, ceramic substrate 11 is joined to aluminum member AP. Since aluminum is relatively soft, the stress in the joining portion can be reduced as compared with the case where ceramic substrate 11 is joined to copper.

(Fourth Embodiment)

The semiconductor device according to the fourth embodiment of the present invention will be hereinafter described.

Figure 8:
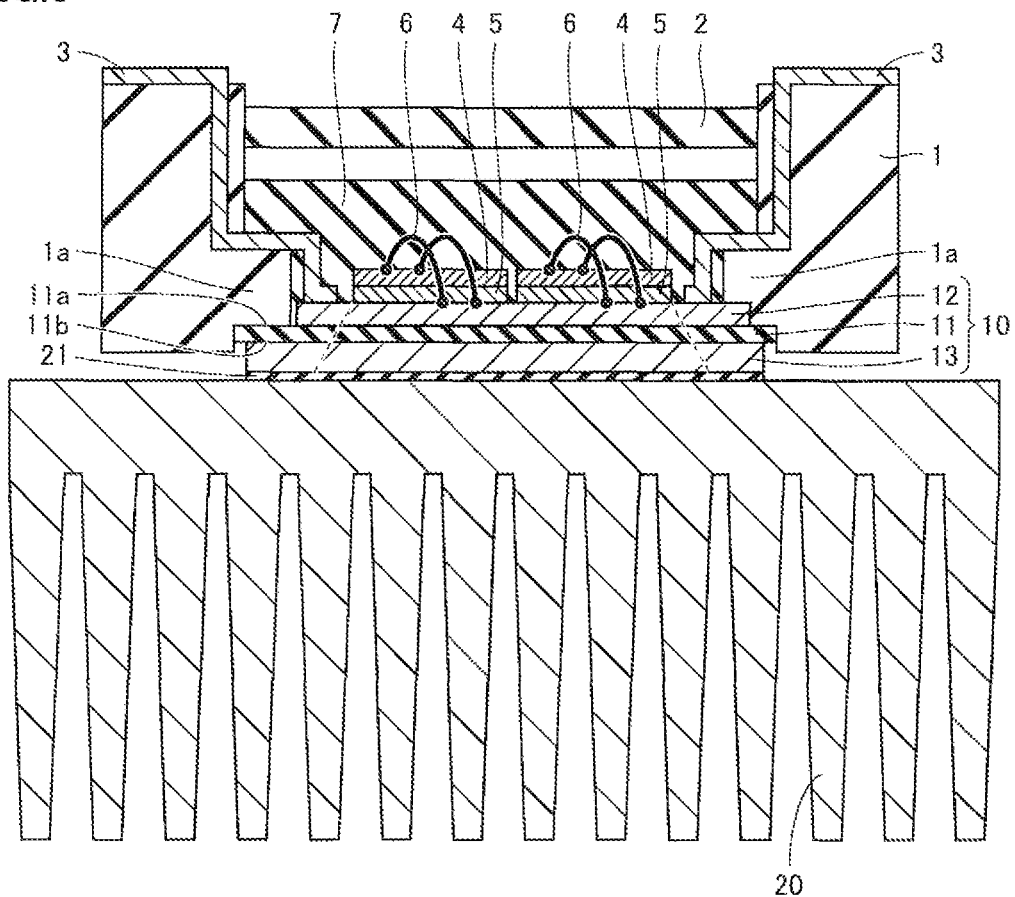
FIG. 8 is a cross-sectional view schematically showing the state where a heat sink is joined to a semiconductor device according to the fourth embodiment of the present invention.

Referring to FIG. 8, the semiconductor device of the fourth embodiment is mainly different from the semiconductor device of the first embodiment in that a heat sink 20 is further provided. Heat sink 20 includes a heat-dissipation fin. The heat sink is made of aluminum, for example. Heat sink 20 covers the entire surface of metal heat-dissipation plate 13. Heat sink 20 is attached to metal heat-dissipation plate 13 with grease 21. Grease 21 is applied between metal heat-dissipation plate 13 and heat sink 20. The thermal conductivity of grease 21 is equal to or greater than 2 W/mK.

Figure 9:
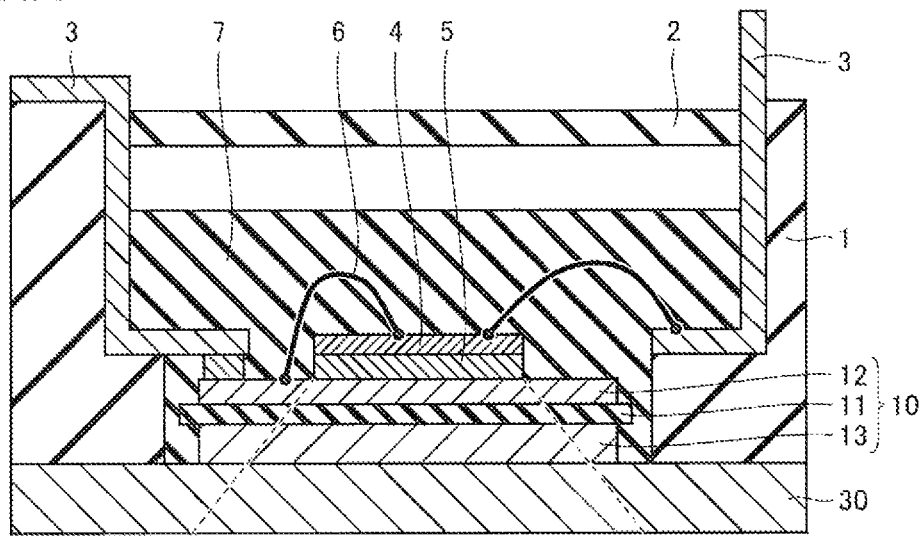
FIG. 9 is a cross-sectional view schematically showing a semiconductor device of Comparative Example.

Then, the functions and effects of the semiconductor device according to the present embodiment will be described in comparison with the semiconductor device of Comparative Example. Referring to FIG. 9, the semiconductor device of Comparative Example is mainly different from the semiconductor device of the present embodiment in that it has a base plate 30. It is to be noted that a heat sink is not shown in FIG. 9 for the sake of clarity.

In the semiconductor device of Comparative Example, the heat generated during use of semiconductor element 4 diffuses to ceramic circuit substrate 10 and base plate 30 as indicated by dashed lines in FIG. 9. Since the semiconductor device of Comparative Example includes base plate 30, the heat generated in semiconductor element 4 spreads from semiconductor element 4 toward the heat sink and diffuses also to base plate 30. Therefore, since the distance between semiconductor element 4 and the heat sink is increased, the heat generated in semiconductor element 4 diffuses to a wide range until this heat reaches the heat sink.

In contrast, the semiconductor device of the present embodiment does not include base plate 30. Accordingly, the heat generated in semiconductor element 4 diffuses from semiconductor element 4 toward heat sink 20 in a range narrower than that in the case of Comparative Example, as indicated by dashed lines in FIG. 8. Accordingly, dissipation of the heat generated in semiconductor element 4 is more greatly influenced by grease 21. According to the semiconductor device of the present embodiment, since the thermal conductivity of grease 21 is equal to or greater than 2 W/mK, grease 21 exhibits relatively high heat dissipation performance. Therefore, the performance for dissipating heat generated in semiconductor element 4 can be enhanced.

EXAMPLES

Examples of the present invention will be hereinafter described.

Figure 10:
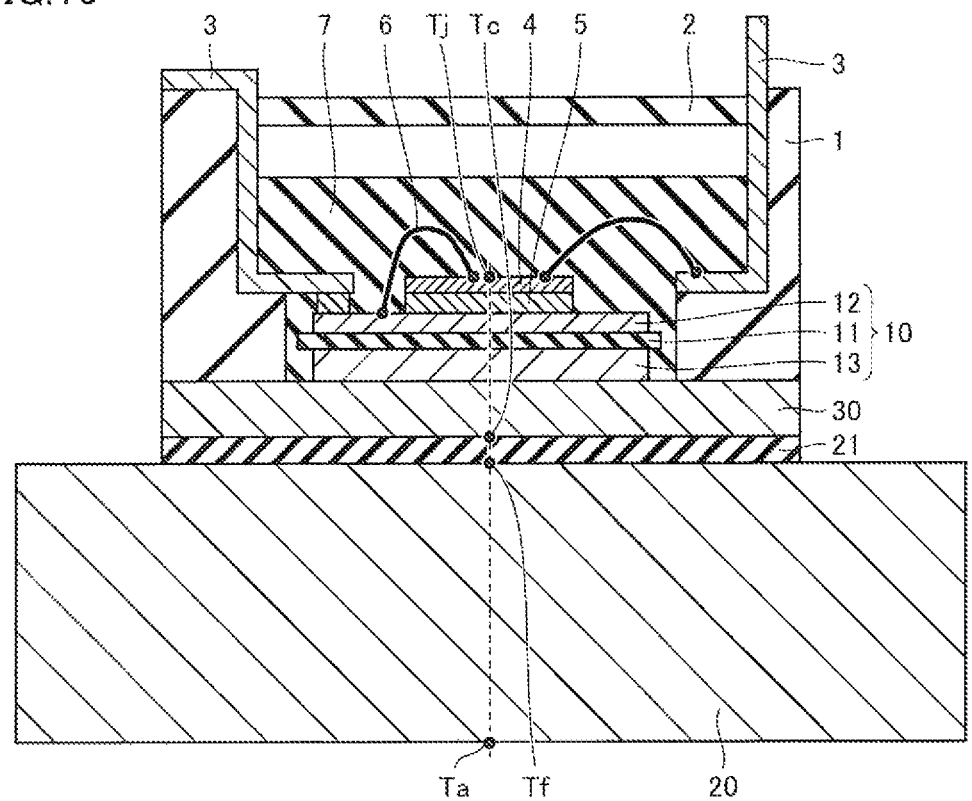
FIG. 10 is a cross-sectional view schematically showing a conventional semiconductor device.

First, the thermal resistances of the semiconductor device of the present invention example and the conventional semiconductor device were measured by simulation. Referring to FIG. 10, the thermal resistance of the semiconductor device will be described using the conventional semiconductor device as an example. The conventional semiconductor device includes a base plate 30. Each thermal resistance between corresponding points Tj, Tc, Tf, and Ta and the thermal resistance between point Tj and point Ta shown in FIG. 10 were measured. Point Tj is located on the upper surface of a semiconductor chip. Point Tc is located at the contact between base plate 30 and grease 21. Point Tf is located at the contact between grease 21 and heat sink 20. Point Ta is located on the lower surface of the heat sink. Furthermore, the semiconductor device of the present invention example does not include a base plate. In the present invention example, point Tf is located at the contact between metal heat-dissipation plate 13 and grease 21.

Figure 11:
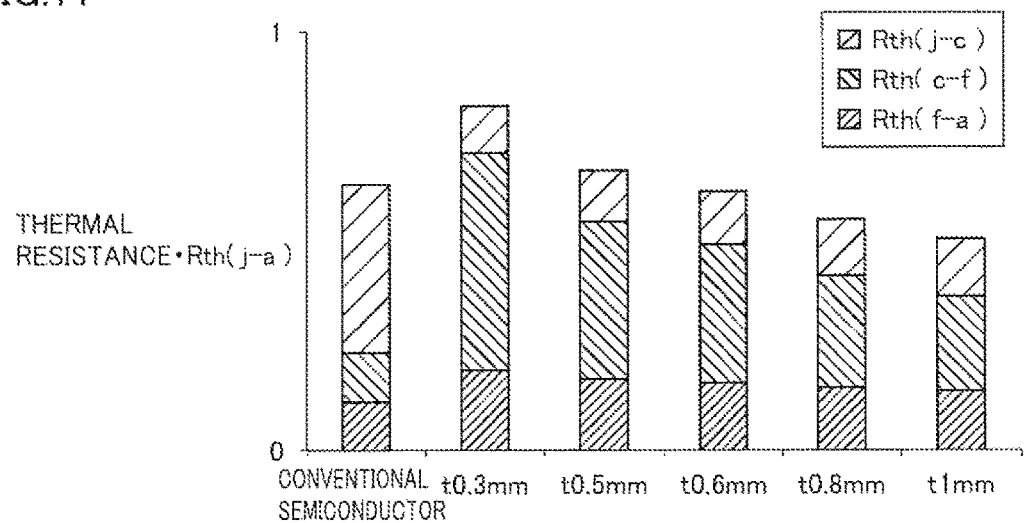
FIG. 11 is a diagram showing thermal resistances of a conventional semiconductor device and a semiconductor device of an example.
Figure 12:
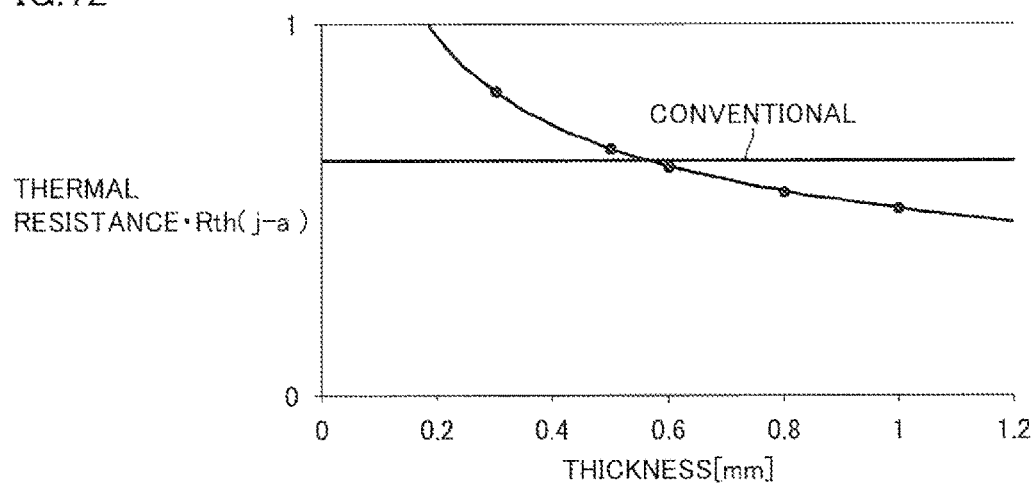
FIG. 12 is a diagram showing the relation between the thermal resistance and the each thickness of a metal circuit board and a metal heat-dissipation plate.

Referring to FIGS. 11 and 12, Rth (j-a) shows a thermal resistance between point Tj and point Ta. Rth (j-c) shows a thermal resistance between point Tj and point Tc. Rth (c-f) shows a thermal resistance between point Tc and point Tf. Rth (f-a) shows a thermal resistance between point Tf and point Ta. The symbol t in FIG. 11 indicates each thickness of the metal circuit board and the metal heat-dissipation plate. It turned out that the thermal resistance obtained in the case where each thickness of the metal circuit board and the metal heat-dissipation plate is 0.6 mm or more shows a value that is lower than the thermal resistance in the case of the conventional semiconductor device. Accordingly, it turned out that, by forming the metal circuit board and the metal heat-dissipation plate to each have a thickness of 0.6 mm or more, the thermal resistance similar to that in the conventional case can be achieved even if a base plate is not provided as in the conventional case.

Then, the warpage in each case of the semiconductor device of the present invention example and the conventional semiconductor device was measured by simulation.

Figure 13:
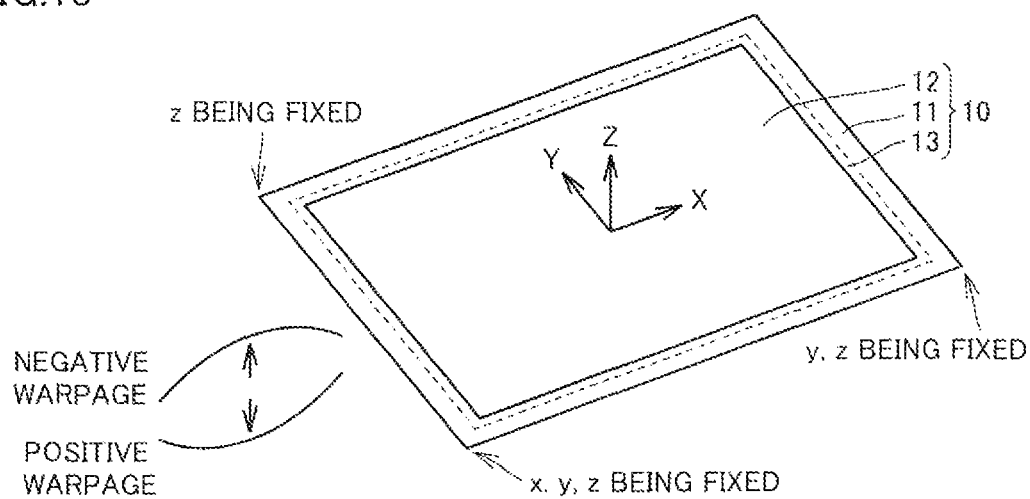
FIG. 13 is a diagram schematically showing the configuration of a ceramic circuit substrate of the example.

Referring to FIG. 13, the warpage amount of ceramic circuit substrate 10 in the present invention example was measured. It is to be noted that a circuit pattern is not shown in FIG. 13 for the sake of clarity. The warpage formed to protrude toward metal circuit board 12 was defined as negative warpage while the warpage formed to protrude toward metal heat-dissipation plate 13 was defined as positive warpage. Also, x, y and z axes shown in FIG. 13 were defined, in which "z" was fixed at one of four corners of ceramic circuit substrate 10; "y" and "z" were fixed at another one of the corners; and "x", "y" and "z" were fixed at still another one of the corners. Under this condition, the warpage amounts in two types (Type A and Type B) of ceramic circuit substrates 10 were measured.

Type A is configured such that metal circuit board 12 has a relatively small circuit pattern area. In Type A, ceramic substrate 11 has outer dimensions having a length of 79 mm and a width of 58.1 mm. Metal circuit board 12 has outer dimensions having a length of 70 mm and a width of 49.1 mm. Metal heat-dissipation plate 13 has outer dimensions having a length of 77.4 mm and a width of 56.5 mm. Type B is configured such that metal circuit board 12 has a circuit pattern larger in area than that in the case of Type A. In Type B, ceramic substrate 11 has outer dimensions having a length of 79 mm and a width of 58.1 mm. Metal circuit board 12 has outer dimensions having a length of 73 mm and a width of 52.1 mm. Metal heat-dissipation plate 13 has outer dimensions having a length of 77 mm and a width of 56.1 mm. In each of Type A and Type B, metal heat-dissipation plate 13 is a solid metal plate.

Figure 14:
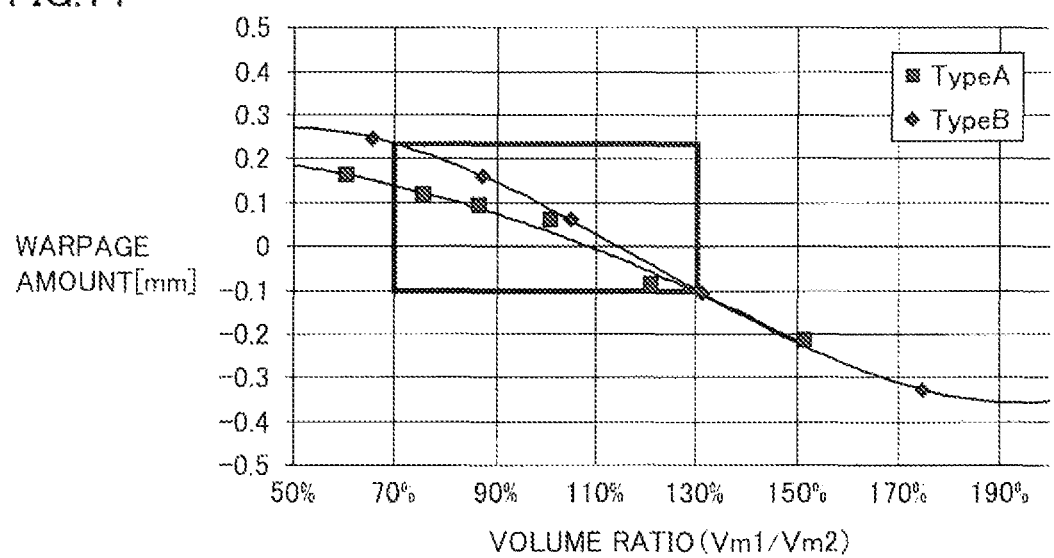
FIG. 14 is a diagram showing the relation between the warpage amount and the volume ratio between the metal circuit board and the metal heat-dissipation plate.

Referring to FIG. 14, Tables 1 and 2, the relation between the warpage amount of ceramic circuit substrate 10 and the ratio between a volume Vm1 of metal circuit board 12 and a volume Vm2 of metal heat-dissipation plate 13 was examined.

Table 1 shows the warpage amount and the like of Type A while Table 2 shows the warpage amount and the like of Type B. In each of Tables 1 and 2, the front pattern indicates metal circuit board 12 while the back pattern indicates metal heat-dissipation plate 13. The volume ratio shows a ratio of volume Vm1 of metal circuit board 12 to volume Vm2 of metal heat-dissipation plate 13.

TABLE 1

| Front Pattern (circuit side) | | Back Pattern (base side) | | | Warpage |
| --- | --- | --- | --- | --- | --- |
| Thickness [mm] | Volume [mm$^3$] | Thickness [mm] | Volume [mm$^3$] | Volume Ratio | amount [mm] |
| 0.8 | 2653.93008 | 0.4 | 1747.86656 | 151.8% | −0.219 |
| 0.8 | 2653.93008 | 0.5 | 2184.8332 | 121.5% | −0.0888 |
| 0.8 | 2653.93008 | 0.6 | 2621.79984 | 101.2% | 0.0566 |
| 0.8 | 2653.93008 | 0.7 | 3058.76648 | 86.8% | 0.0919 |
| 0.8 | 2653.93008 | 0.8 | 3495.73312 | 75.9% | 0.1147 |
| 0.8 | 2653.93008 | 1 | 4369.6664 | 60.7% | 0.16 |

TABLE 2

| Front Pattern (circuit side) | | Back Pattern (base side) | | | Warpage |
| --- | --- | --- | --- | --- | --- |
| Thickness [mm] | Volume [mm$^3$] | Thickness [mm] | Volume [mm$^3$] | Volume Ratio | amount [mm] |
| 0.6 | 1987.9161 | 0.3 | 1136.86965 | 174.9% | −0.327 |
| 0.6 | 1987.9161 | 0.4 | 1515.8262 | 131.1% | −0.1069 |
| 0.6 | 1987.9161 | 0.5 | 1894.78275 | 104.9% | 0.061 |
| 0.6 | 1987.9161 | 0.6 | 2273.7393 | 87.4% | 0.161 |
| 0.6 | 1987.9161 | 0.8 | 3031.6524 | 65.6% | 0.249 |

Usually, grease has a thickness of 0.1 mm. Accordingly, the warpage amount of the ceramic circuit substrate exceeding 0.1 mm causes a problem that the heat dissipation performance of grease cannot be ensured. Specifically, in the case of negative warpage, the metal heat-dissipation plate is separated from the heat sink, which leads to generation of voids in grease. Furthermore, in the case of positive warpage, the metal heat-dissipation plate is located closer to the heat sink. Accordingly, the metal heat-dissipation plate may push away grease, thereby leading to generation of voids in grease at the time when the ceramic circuit substrate returns to an unwarped state. In this way, when the warpage amount of the ceramic circuit substrate exceeds 0.1 mm, voids occur in grease, so that it becomes difficult to ensure heat dissipation performance. For this reason, it is preferable that the warpage amount of the ceramic circuit substrate is set at 0.1 mm or less. In the case of positive warpage, voids may not occur in grease even if the metal heat-dissipation plate is located closer to the heat sink. In consideration of the above, it turned out that the ratio of volume Vm1 of metal circuit board 12 to volume Vm2 of metal heat-dissipation plate 13 is preferably 70% or more and 130% or less.

It also turned out that the warpage amount reaches zero when the metal circuit board is greater in volume than the metal heat-dissipation plate. Specifically, it turned out that the warpage amount reaches zero when the ratio of volume Vm1 of the metal circuit board to volume Vm2 of the metal heat-dissipation plate is about 110%. In consideration of the above, it turned out that the metal circuit board is preferably greater in volume than the metal heat-dissipation plate.

Furthermore, it turned out that the ratio of the thickness of the metal circuit board to the thickness of the metal heat-dissipation plate is preferably 6/5 or more and 4/3 or less.

Then, the thermal resistances of the semiconductor device of the present invention example and the conventional semiconductor device using grease varied in characteristics were measured by simulation.

Figure 15:
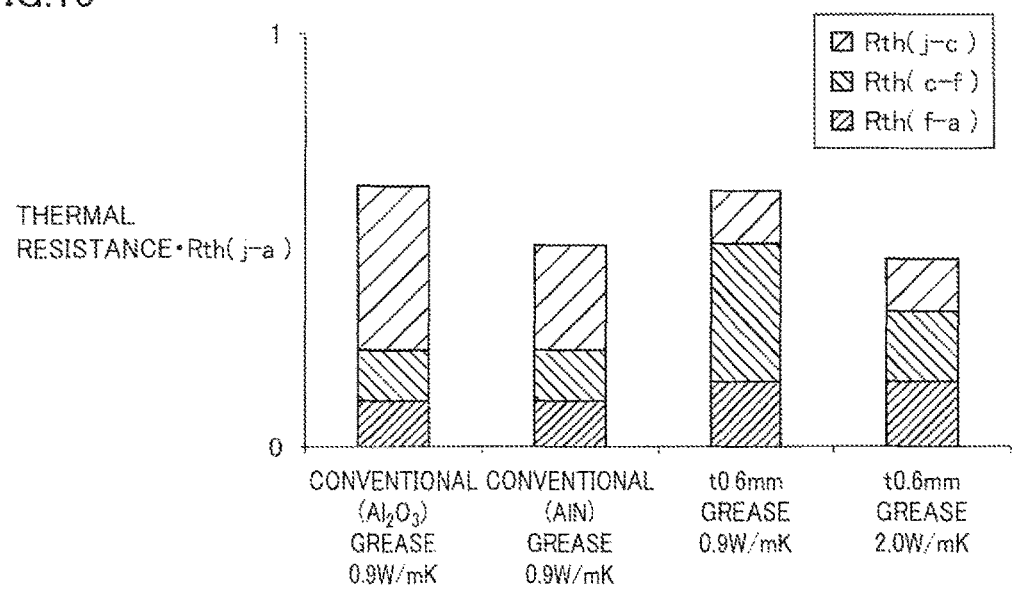
FIG. 15 is a diagram showing thermal resistances of the conventional semiconductor devices and the semiconductor devices of examples.

Referring to FIG. 15, it turned out that the semiconductor device of the present invention example using grease having a thermal conductivity of 0.9 W/mK is lower in thermal resistance than the conventional semiconductor device using grease having a thermal conductivity of 0.9 W/mK and including a ceramic substrate made of aluminum oxide. Furthermore, it turned out that the semiconductor device of the present invention example using grease having a thermal conductivity of 2.0 W/mK is lower in thermal resistance than the conventional semiconductor device using grease having a thermal conductivity of 0.9 W/mK and including a ceramic substrate made of aluminum nitride. Furthermore, it turned out that grease has a thermal conductivity of 2.0 W/mK in the present invention example, so that the thermal resistance is significantly decreased.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A semiconductor device comprising:
a semiconductor element; and
a ceramic circuit substrate on which said semiconductor element is mounted,
said ceramic circuit substrate including
a ceramic substrate having one surface and the other surface that face each other,
a metal circuit board joined to said one surface of said ceramic substrate and electrically connected to said semiconductor element, and
a metal heat-dissipation plate joined directly to said other surface of said ceramic substrate,
said metal circuit board being greater in thickness than said metal heat-dissipation plate,
a surface of said metal heat-dissipation plate on a side opposite to said ceramic substrate being larger in area than a surface of said metal circuit board on a side opposite to said ceramic substrate.

2. The semiconductor device according to claim 1, wherein a ratio of a volume of said metal circuit board to a volume of said metal heat-dissipation plate is 70% or more and 130% or less.

3. The semiconductor device according to claim 1, wherein said metal circuit board is greater in volume than said metal heat-dissipation plate.

4. The semiconductor device according to claim 1, wherein a ratio of a thickness of said metal circuit board to a thickness of said metal heat-dissipation plate is 6/5 or more and 4/3 or less.

5. The semiconductor device according to claim 1, wherein said ceramic substrate includes silicon nitride.

6. The semiconductor device according to claim 1, wherein each of said metal circuit board and said metal heat-dissipation plate includes copper.

7. The semiconductor device according to claim 1, wherein
each of said metal circuit board and said metal heat-dissipation plate includes a copper member and an aluminum member covering said copper member, and
said ceramic substrate is joined to both of said aluminum member of said metal circuit board and said aluminum member of said metal heat-dissipation plate.

8. The semiconductor device according to claim 1, further comprising a heat sink, wherein
said heat sink is attached to said metal heat-dissipation plate with grease, and
said grease has a thermal conductivity of 2 W/mK or more.

9. The semiconductor device according to claim 1, wherein said semiconductor element includes a material having an energy band gap of 2 eV or more.

10. The semiconductor device according to claim 1, further comprising a casing that supports said ceramic substrate, wherein
said casing includes a projecting portion projecting directly above said one surface of said ceramic substrate and resting on said one surface, and
at least a part of said metal heat-dissipation plate is located so as to overlap with said projecting portion when viewed from a direction in which said one surface and said other surface face each other.

11. The semiconductor device according to claim 1, wherein
said metal heat-dissipation plate includes
a first surface joined to said ceramic substrate and
a second surface facing said first surface, and
said metal heat-dissipation plate has a concave portion formed in said second surface.

* * * * *